United States Patent

Katnack

[15] 3,667,008

[45] May 30, 1972

[54] SEMICONDUCTOR DEVICE EMPLOYING TWO-METAL CONTACT AND POLYCRYSTALLINE ISOLATION MEANS

[72] Inventor: Fredric Leroy Katnack, Somerset, N.J.

[73] Assignee: RCA Corporation

[22] Filed: Oct. 24, 1970

[21] Appl. No.: 84,958

[52] U.S. Cl. ....................317/235 R, 317/234 M, 317/234 N, 317/235 WW, 317/235 Y, 317/235 Z, 317/235 AT

[51] Int. Cl. ......................................H01l 11/00, H01l 15/00

[58] Field of Search .....................317/234, 235, 5.2, 5.3, 5.4, 317/40.12, 40.13, 48.7

[56] References Cited

UNITED STATES PATENTS

| | | | |
|---|---|---|---|
| 3,443,175 | 5/1969 | Czorny et al. | 317/235 |
| 3,460,007 | 8/1969 | Scott | 317/235 |
| 3,504,239 | 3/1970 | Johnson et al. | 317/235 |
| 3,559,003 | 1/1971 | Beaudouin et al. | 317/235 |
| 3,570,114 | 3/1971 | Bean et al. | 317/235 |

*Primary Examiner*—John W. Huckert
*Assistant Examiner*—Andrew J. James
*Attorney*—Glenn H. Bruestle

[57] ABSTRACT

A device is formed in a semiconductor body having a major surface, with an insulating coating over the surface having an aperture exposing a portion thereof. A polycrystalline semiconductor layer is disposed in the aperture and over the coating, and a refractory metal layer overlies a portion of the semiconductor layer. A metal layer having low temperature properties overlies another portion of the semiconductor layer and is spaced from the refractory layer by a third portion of the semiconductor layer which provides metallurgical isolation and selective resistance between the two metal layers. Termination means contacts the low temperature layer.

8 Claims, 1 Drawing Figure

Patented May 30, 1972 3,667,008
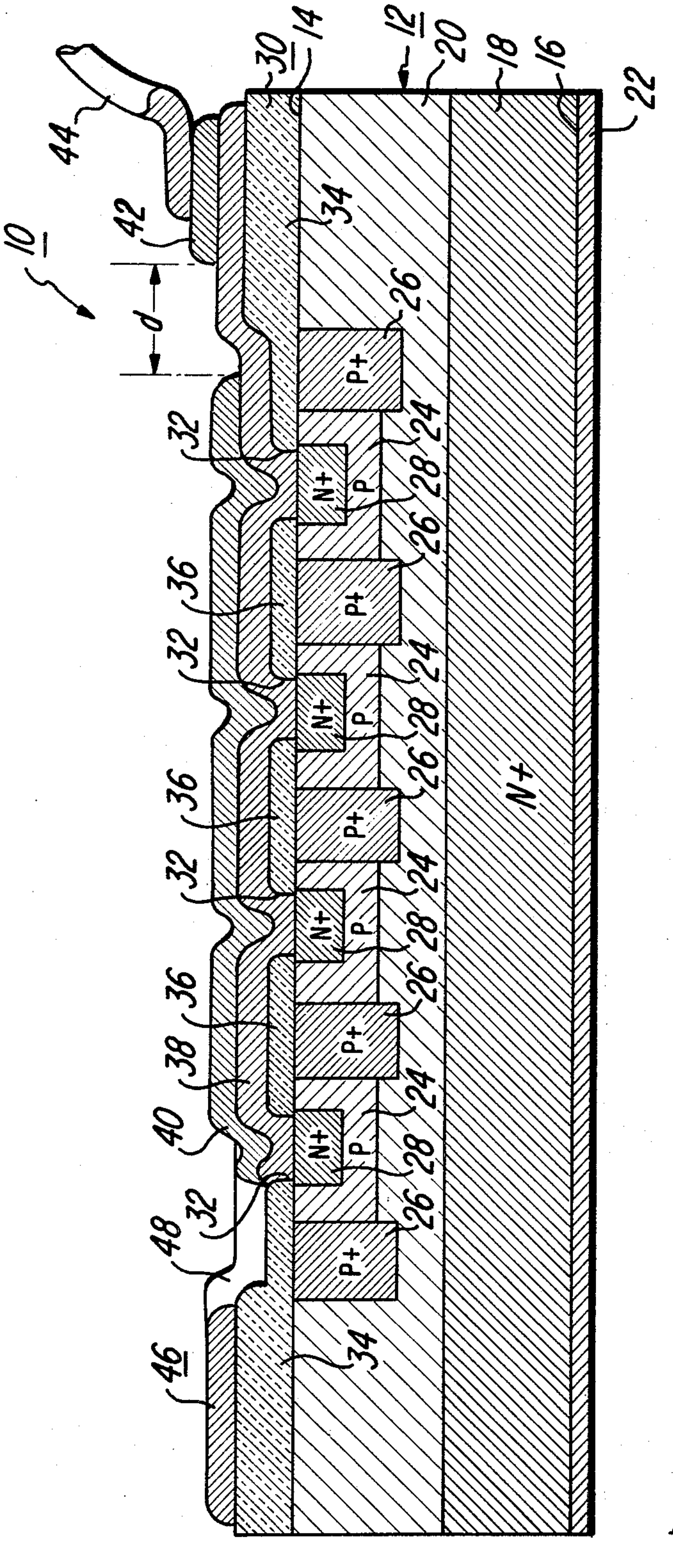
INVENTOR.
Fredric L. Katnack
BY Herbert L. Allen
ATTORNEY

SEMICONDUCTOR DEVICE EMPLOYING TWO-METAL CONTACT AND POLYCRYSTALLINE ISOLATION MEANS

BACKGROUND OF THE INVENTION

The invention herein disclosed was made in the course of or under contract or subscontract with the Department of the Army.

The present invention relates to semiconductor devices, and relates in particular to improved contact structures for rectifiers, transistors, integrated circuits and the like.

The semiconductor industry presently employs a variety of contact structures in the manufacture of semiconductor devices. To some extent, the desired production cost and reliability requirements dictate the materials and fabrication techniques to be employed. For example, while evaporated aluminum contacts adhere well to silicon and silicon dioxide and are cheap and relatively easy to fabricate, it is known that aluminum layers have several serious disadvantages. For example, aluminum tends to cause "pinhole" shorts when deposited over thin silicon dioxide insulating coatings. Aluminum is a highly mobile P type impurity, and causes undesirable doping when evaporated on to a semiconductor region of N type conductivity. The silicon-aluminum eutectic forms at very low processing temperatures, e.g. about 550°–600° C, and aluminum has a relatively low melting temperature of about 600° C. Further, aluminum tends to migrate in the direction of electron flow under high temperature operating conditions, often resulting in device failure. Despite these disadvantages, aluminum is still widely employed as a contact metal.

Some semiconductor devices require contact structures having a higher reliability factor; notable are integrated circuits and power transistors. In investigations for more reliable contact structures, it has been found that deposited films of refractory metals, especially tungsten and molybdenum, offer highly conductive contact layers which do not react with silicon dioxide, melt at temperatures between 3,000° and 4,000° C, and have very high eutectic-forming temperatures. These advantages are especially beneficial for power devices, since they improve the ability of the device to operate at high temperatures. However, these refractory contact layers exhibit at least one major disadvantage; namely, refractory metals deposited by known methods are relatively brittle. Thus, the widely used aluminum and gold terminal leads do not bond well to either tungsten or molybdenum contact layers.

One known contact structure provides means for bonding gold lead wires to a refractory contact layer. The structure comprises a molybdenum layer bridging the silicon dioxide coating and making contact to the silicon body through an aperture in the silicon dioxide. A metal layer having low temperature properties, comprising either aluminum or gold, is evaporated over the molybdenum layer, allowing gold wire to be bonded to the molybdenum-low temperature metal structure.

Yet for high temperature operation, the above-described combination structure still suffers a serious disadvantage. That is, unwanted metallurgical reactions are often caused by the interaction of the different metals at elevated temperatures, and, again these reactions often result in device failure. It would therefore be desirable, for bonding pads to which wire leads are to be attached, to employ a metal layer having low temperature properties and which is metallurgically isolated from the refractory layer.

SUMMARY OF THE INVENTION

The present invention comprises a semiconductor device formed in a semiconductor body having a major surface. An insulating coating overlies the surface, and has an aperture therein which extends to the surface. A first layer of a metal having relatively high temperature properties overlies the coating and the aperture, and a second layer of a metal having a relatively low temperature properties overlies the coating and is spaced apart from the first layer. A polycrystalline semiconductor layer is interposed between, and contacts the first and second layers, and terminal means contacts the second layer.

THE DRAWING

The single FIGURE of the drawing is a cross-section of an overlay transistor employing the contact structure of the present invention.

DETAILED DESCRIPTION

An overlay transistor, referred to generally as 10, is formed in a semiconductor, e.g., silicon, body 12 having upper and lower major surfaces 14 and 16, respectively. The transistor 10 may comprise an NPN or PNP device; however an NPN device is shown in the drawing and described below. The dimensions of the body 12 and the conductivity and thickness of the semiconductor regions of the device are not critical, and may be practiced according to the teachings of U.S. Pat. No. 3,434,019 to Carley.

The transistor 10 includes an N+ collector substrate 18 adjacent the lower surface 16, and an N type collector region 20 adjacent the substrate 18. The N type collector region 20 extends to the upper surface 14 at the periphery of the body 12. A collector contact 22 is disposed on the lower surface 16. A plurality of P type base regions 24 extend into the collector region 20 from the upper surface 14, and a P+ conductive grid 26 is disposed between adjacent base regions 24. An emitter region 28 extends into each base region 24 from the upper surface 14.

An insulating coating 30, for example, silicon dioxide, is disposed over the upper surface 14. The coating 30 has a plurality of apertures 32 therein which extend through the coating. Each aperture 32 exposes one of the emitter regions 28 at the upper surface 14. As is known, the coating 30 is of varied thickness because of the particular manner in which the transistor 10 is fabricated. Thus, the coating 30 includes a relatively thick portion 34 adjacent to, and overlying the collector region 20 at the periphery of the body 12, and a relatively thin portion 36 adjacent to and overlying the base regions 24 and the conductive grid 26.

A layer 38 of N type polycrystalline silicon is disposed over both the thick and thin portions 34, 36 of the coating 30, and contacts all of the emitter regions 28 through the apertures 32. The silicon layer 38 is preferably between 1,000 and 10,000 A. thick and has an impurity concentration of between $10^{19}$ and $10^{21}$ atoms/cm.$^3$ If the transistor 10 is a PNP device, the polycrystalline silicon layer is P type and also has an impurity concentration in the same range.

A first layer 40 of a metal having relatively high temperature properties is disposed only over that portion of the silicon layer 38 which overlies the thin portion 36 to the insulating coating 30. The term "relatively high temperature properties" is intended to mean that the metal layer 40 either has a melting temperature substantially in excess of 1,000° C, or forms a eutectic with the semiconductor material of the layer 38 at temperatures in excess of 1,000° C. When the semiconductor layer 38 is silicon, the first layer 40 suitably comprises a refractory metal, such as tungsten or molybdenum. Tungsten, which melts above 3,000° C and forms a eutectic with silicon at about 1,400° C, is preferred. The thickness of this layer 40 is not critical, and may be between 5,000 and 50,000 A thick.

A second layer 42 of a metal having relatively low temperature properties, i.e., melts below 1,000° C, or forms the silicon eutectic below or at about 1,000° C, is disposed over that part of the silicon layer 38 which overlies the thick portion 34 of the insulating coating 30. The second layer 42 is spaced a distance "*d*" from the first metal layer 40. Preferably, the second metal layer 42 is selected from the group consisting of aluminum, gold, silver, and platinum, which metals have melting temperatures of about 660°., 1,063°, 960°, and 1,765° C, respectively, and silicon eutectic forming temperatures of 577°, 370°, 830°, and 980° C, respectively. The second metal layer is suitably between 1,000 and 25,000 A thick.

A terminal lead 44 is bonded in contact to the second metal layer 42 which overlies the thick portion 34 of the coating 30. The transistor 10 is completed with a base contact layer 46 having fingers 48 which make contact to the P+ grid 26 through slots (not shown) in the coating 30.

The transistor and the contact structure may be fabricated by known techniques. For example, the semiconductor region profile of the semiconductor body 12 may be made in accordance with the aforementioned patent to Carley. The polycrystalline silicon layer 38 may be formed by depositing a polycrystalline layer over the entire surface of the coating 30, and defining the desired configuration of the silicon layer 38 by standard photoresist-etch techniques. The refractory metal layer 40 may be deposited by reduction of the hexafluoride of the refractory metal, in accordance with the teachings of U.S. Pat. No. 3,477,872 to Amick. The low temperature metal layer 42 may be deposited by standard evaporation techniques, followed by a photoresist-etch definition sequence.

The contact structure of the transistor 10 offers, among others, the following advantages. First, the distance *d* along the silicon layer 38 provides a good degree of metallurgical isolation between the two metal layers, thus preventing the deleterious metallurgical reactions otherwise caused by the interaction of the different metals at elevated temperatures. Second, the polycrystalline silicon along the distance *d* provides a good degree of thermal isolation between the two metal layers, since silicon has a relatively low thermal conductivity characteristic. Third, that distance *d* of the silicon layer 38 between the two metal layers 40 and 42 defines a degree of ballasting resistance, which value can be selectively defined by controlling the location of the two metal layers and the impurity concentration of the polycrystalline silicon. Fourth, the silicon layer 38 within each aperture 32 provides additional ballasting resistance between the refractory layer 40 and each emitter region 28. Fifth, the refractory metal layer 40 is located near the emitter regions 28 where the greatest amount of heat is generated during operation of the device. The low temperature metal, on the other hand, is located only over the thick collector oxide where the operating temperature of the device is relatively low.

I claim:

1. A semiconductor device comprising:
a semiconductor body having a major surface;
an insulating coating overlying said surface, said coating having an aperture extending to said surface;
a first layer of a metal having relatively high temperature properties overlying said coating and said aperture;
a second layer of a metal having relatively low temperature properties overlying said coating and spaced apart from said first layer;
a polycrystalline semiconductor layer interposed between, and contacting said first and second layers; and
termination means contacting said second layer.

2. A semiconductor device according to claim 1, further comprising resistive means disposed in said aperture between said first layer and said surface.

3. A semiconductor device according to claim 2, wherein said resistive means and said polycrystalline semiconductor layer comprise an integral layer of polycrystalline semiconductor material disposed over said coating and in said aperture.

4. A semiconductor device according to claim 3, wherein said first layer comprises a refractory metal.

5. A semiconductor device according to claim 4, wherein said second layer is selected from a group consisting of gold, silver, aluminum, and platinum.

6. In a semiconductor device of the type having a relatively high temperature operating area and a relatively low temperature operating area, a contact structure comprising:
a first layer of a metal having relatively high temperature properties overlying and in electrical contact with said high temperature operating area;
a second layer of a metal having relatively low temperature properties overlying and electrically isolated from said low temperature operating area;
a polycrystalline semiconductor layer interposed between said first and second layers;
termination means contacting said second layer; and wherein
said first and second layers and said polycrystalline semiconductor layer define a current path between said termination means and said high temperature operating area.

7. A semiconductor device comprising in combination:
a silicon body having a major surface;
a silicon oxide coating overlying said surface, said coating having an aperture extending to said surface;
a polycrystalline silicon layer disposed over said coating and in said aperture, said silicon layer having an impurity concentration of between $10^{19}$ and $10^{21}$ atoms/cm$^3$;
a refractory metal layer disposed on a first portion of said silicon layer;
a second metal layer selected from the group consisting of gold, silver, aluminum, and platinum disposed on a second portion of said silicon layer;
said second layer being spaced from said refractory layer by a third portion of said silicon layer which provides metallurgical isolation and a selective resistance between said two metal layers; and
a terminal lead bonded to said second layer.

8. An improved overlay transistor of the type formed in a semiconductor body having a major surface, said transistor including a collector region therein which extends to said surface, a plurality of base regions extending into said collector region from said surface, a base conduction grid between adjacent base regions, an emitter region extending into each base region from said surface, an insulating coating overlying said surface and having a plurality of apertures each of which exposes one emitter region, said coating having a relatively thick portion adjacent said collector region and a relatively thin portion adjacent said base regions, wherein the improvement comprises:
a polycrystalline semiconductor layer disposed over said thick and thin portions and contacting said emitter regions through said apertures;
a refractory metal layer disposed only over that part of said semiconductor layer over said thin portion;
a metal layer having low temperature properties spaced from said refractory layer and disposed over that part of said semiconductor layer over said thick portion; and
a terminal lead bonded to said low temperature layer over said thick portion.

* * * * *

UNITED STATES PATENT OFFICE
CERTIFICATE OF CORRECTION

Patent No. 3,667,008 Dated May 30, 1972

Inventor(s) Fredric Leroy Katnack

It is certified that error appears in the above-identified patent and that said Letters Patent are hereby corrected as shown below:

The filing date is October 29, 1970.

Signed and sealed this 12th day of September 1972.

(SEAL)
Attest:

EDWARD M.FLETCHER,JR.
Attesting Officer

ROBERT GOTTSCHALK
Commissioner of Patents